(12) United States Patent
Fu et al.

(10) Patent No.: US 11,805,627 B2
(45) Date of Patent: Oct. 31, 2023

(54) DATA CENTER HEAT RECOVERY SYSTEM

(71) Applicant: Fulian Precision Electronics (Tianjin) Co., LTD., Tianjin (CN)

(72) Inventors: Yen-Chun Fu, New Taipei (TW); Tze-Chern Mao, New Taipei (TW); Chao-Ke Wei, New Taipei (TW); Chih-Hung Chang, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 207 days.

(21) Appl. No.: 17/148,835

(22) Filed: Jan. 14, 2021

(65) Prior Publication Data

US 2022/0053671 A1  Feb. 17, 2022

(30) Foreign Application Priority Data

Aug. 12, 2020 (CN) .......................... 202010808794.X

(51) Int. Cl.
*H05K 7/20* (2006.01)

(52) U.S. Cl.
CPC ..... *H05K 7/20827* (2013.01); *H05K 7/20745* (2013.01); *H05K 7/20836* (2013.01)

(58) Field of Classification Search
CPC ................ F24D 15/04; H05K 7/20827; H05K 7/20745; H05K 7/20836; H05K 7/208; F25B 30/06
See application file for complete search history.

(56) References Cited

U.S. PATENT DOCUMENTS

| 4,313,310 | A  | * | 2/1982 | Kobayashi | F25D 16/00 62/332 |
| 2004/0221604 | A1 | * | 11/2004 | Ota | H05K 7/20781 361/691 |
| 2012/0218711 | A1 | * | 8/2012 | Kashirajima | F25B 25/00 361/700 |
| 2016/0174417 | A1 | * | 6/2016 | Hachiya | H05K 7/208 62/504 |

FOREIGN PATENT DOCUMENTS

| CN | 205299850 U | 6/2016 |
| CN | 108566761 A | 9/2018 |
| CN | 208124513 U | 11/2018 |
| CN | 209013327 U | 6/2019 |
| TW | 201722250 A | 6/2017 |

\* cited by examiner

*Primary Examiner* — Ana M Vazquez
(74) *Attorney, Agent, or Firm* — ScienBiziP, P.C.

(57) ABSTRACT

A data center heat recovery system includes a building heat pump system providing a first liquid when an ambient temperature is lower than a first preset temperature, a heat exchanger receiving the first liquid from the building heat pump system when the ambient temperature is lower than the first preset temperature, and modular data centers. Each of the modular data centers includes an air chiller and a data center. Each of the modular data centers is coupled to the heat exchanger through a second pipeline containing a second fluid. When the ambient temperature is higher than a second preset temperature, the air chiller cools the second fluid. When the ambient temperature is lower than the first preset temperature, the heat exchanger collects heat from the second fluid, and the heat exchanger transports the collected heat to the building heat pump system through the first fluid in the first pipeline.

20 Claims, 5 Drawing Sheets

DATA CENTER HEAT RECOVERY SYSTEM

FIELD

The subject matter herein generally relates to power supplies, and more particularly to a power supply for an electronic device.

BACKGROUND

In cold weather, most buildings have heat pump systems for heating. However, waste heat generated by a computer room or air conditioner of the building is lost to the external environment.

BRIEF DESCRIPTION OF THE DRAWINGS

Implementations of the present disclosure will now be described, by way of embodiments, with reference to the attached figures.

DETAILED DESCRIPTION

Figure 1:
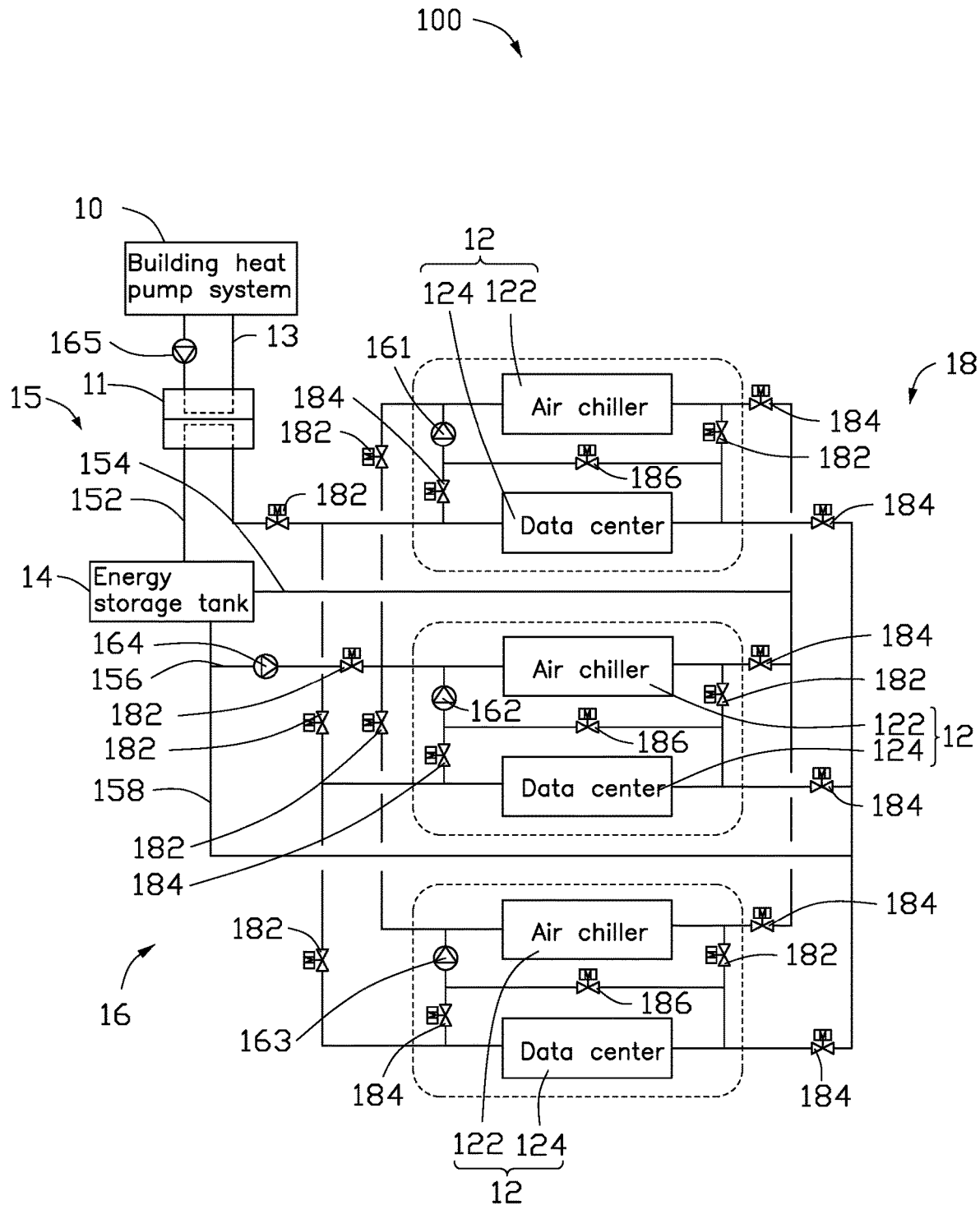
FIG. 1 is a schematic diagram of a data center heat recovery system according to an embodiment.

It will be appreciated that for simplicity and clarity of illustration, where appropriate, reference numerals have been repeated among the different FIGures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

FIG. 1 shows an embodiment of a data center heat recovery system 100, including a building heat pump system 10, a heat exchanger 11 coupled to the building heat pump system 10 through a first pipeline 13, and at least one modular data center 12.

The building heat pump system 10 is used to provide a first fluid (not shown) when the ambient temperature is lower than a first preset temperature. The heat exchanger 11 receives the first fluid from the building heat pump system 10 when the ambient temperature is lower than the first preset temperature and forms a fluid circulation system with the building heat pump system 10.

Each of the modular data centers 12 includes an air chiller 122 and a data center 124. Each of the modular data centers 12 is coupled to the heat exchanger 11 through a second pipeline 15. The data center 124 generates heat during operation, and a second fluid (not shown) flows in the second pipeline 15. The air chiller 122 is used to cool the second fluid when the ambient temperature is higher than a second preset temperature. When the ambient temperature is lower than the first preset temperature, the air chiller 122 does not operate. The second fluid after passing through the data center 124 is transferred to the heat exchanger 11. The heat exchanger 11 collects the heat from the second fluid and passes the collected heat to the building heat pump system 10 through the first fluid in the first pipeline 13, and then the building heat pump system 10 uses the heat to heat the building.

In one embodiment, the first preset temperature is 10 degrees Celsius, and the second preset temperature is 20 degrees Celsius. In other embodiments, the first preset temperature may be higher or lower than 10 degrees Celsius, and the second preset temperature may be higher or lower than 20 degrees Celsius, as long as the first preset temperature is lower than the second preset temperature. In one embodiment, the heat exchanger 11 is a plate heat exchanger, but is not limited thereto.

The data center heat recovery system 100 further includes an energy storage tank 14, and the second pipeline 15 includes a first sub-pipeline 152, a second sub-pipeline 154, a third sub-pipeline 156, and a fourth sub-pipeline 158. The data center heat recovery system 100 further includes a plurality of water pumps 16 and a plurality of electric two-way valves 18. The plurality of water pumps 16 includes a first water pump 161, a second water pump 162, a third water pump 163, a fourth water pump 164, and a fifth water pump 165. The fifth water pump 165 is used to transport the first fluid in the first pipeline 13, and the first water pump 161, the second water pump 162, the third water pump 163, and the fourth water pump 164 are used to transport the second fluid in the second pipeline 15. The plurality of electric two-way valves 18 includes a plurality of first electric two-way valves 182 and a plurality of second electric two-way valves 184. The opening or closing of the electric two-way valves 18 controls the flow of the second fluid in the second pipeline 15.

Figure 2:
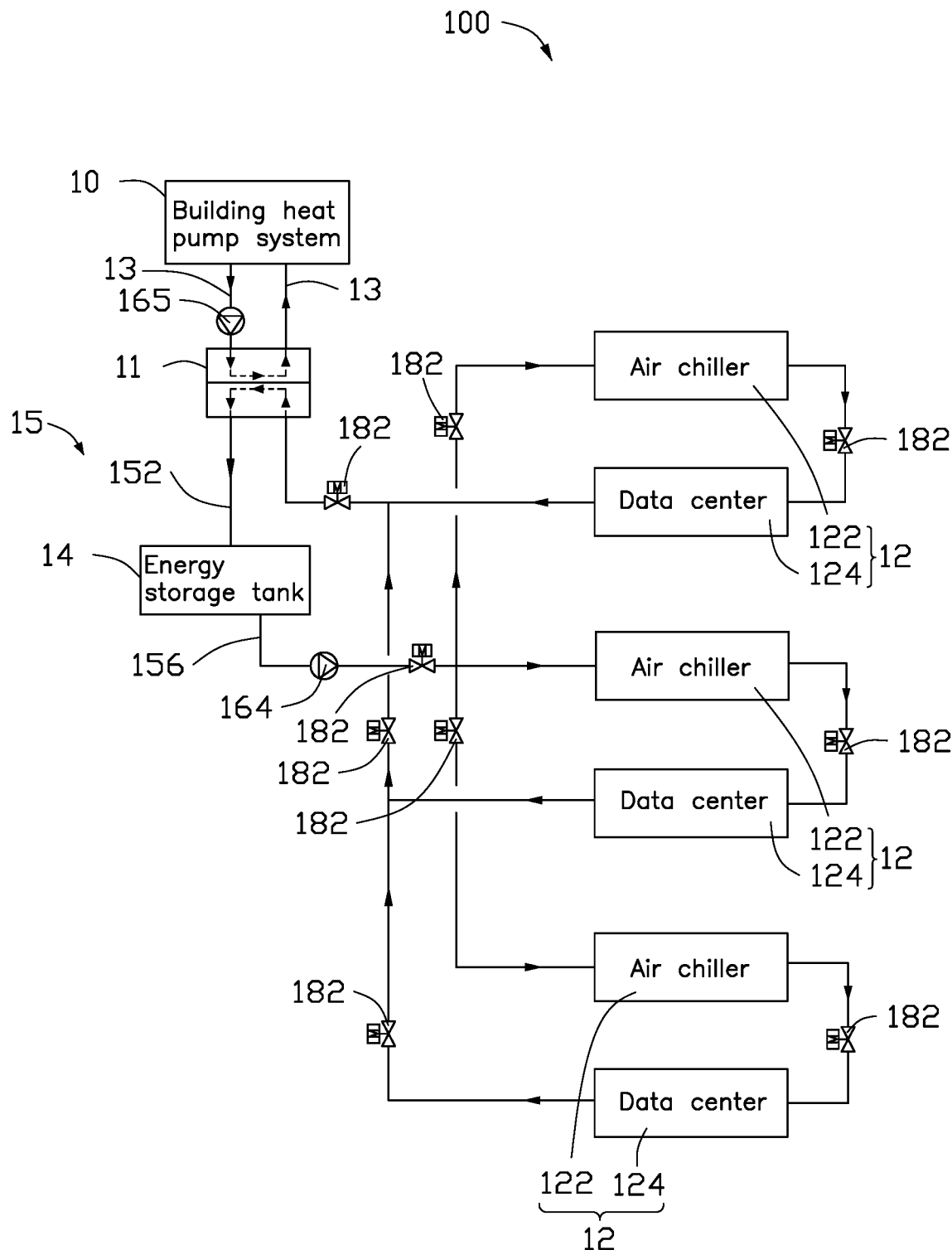
FIG. 2 is a schematic diagram of the operation of the data center heat recovery system according to an embodiment when the temperature is low.

Referring to FIG. 2, in one embodiment when the ambient temperature is lower than the first preset temperature, the data center heat recovery system 100 automatically turns off the first water pump 161, the second water pump 162, the third water pump 163, and all of the second electric two-way valves 184, and simultaneously maintains the fourth water pump 164, the fifth water pump 165, the first electric two-way valves 182, and the third electric two-way valves 186 in an open state. At this time, all of the air chillers 122 stop working, and the data center heat recovery system 100 is in a low-temperature heat recovery mode.

Figure 3:
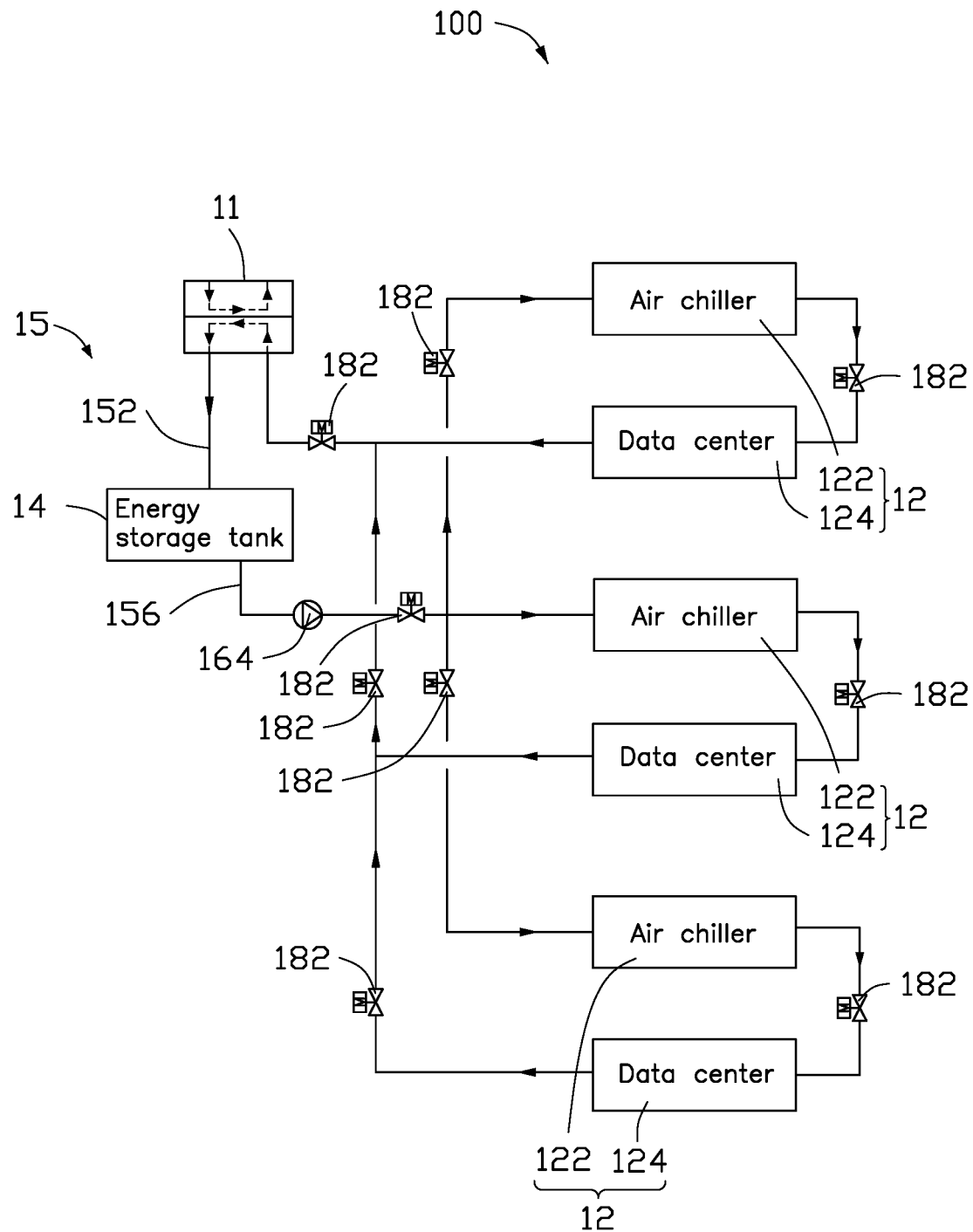
FIG. 3 is a schematic diagram of an emergency cooling operation of the data center heat recovery system according to an embodiment when the temperature is low.

Referring to FIG. 3, in one embodiment when the ambient temperature is lower than the first preset temperature, the data center heat recovery system 100 automatically turns off the first water pump 161, the second water pump 162, the third water pump 163, the fifth water pump 165, all of the second electric two-way valves 184, and all of the third electric two-way valves 186, and simultaneously maintains the fourth water pump 164, the fifth water pump 165, the first electric two-way valves 182, and the third electric two-way valves 186. At this time, all of the air chillers 122 stop working, and the data center heat recovery system 100 is in a low-temperature emergency cooling mode.

Figure 4:
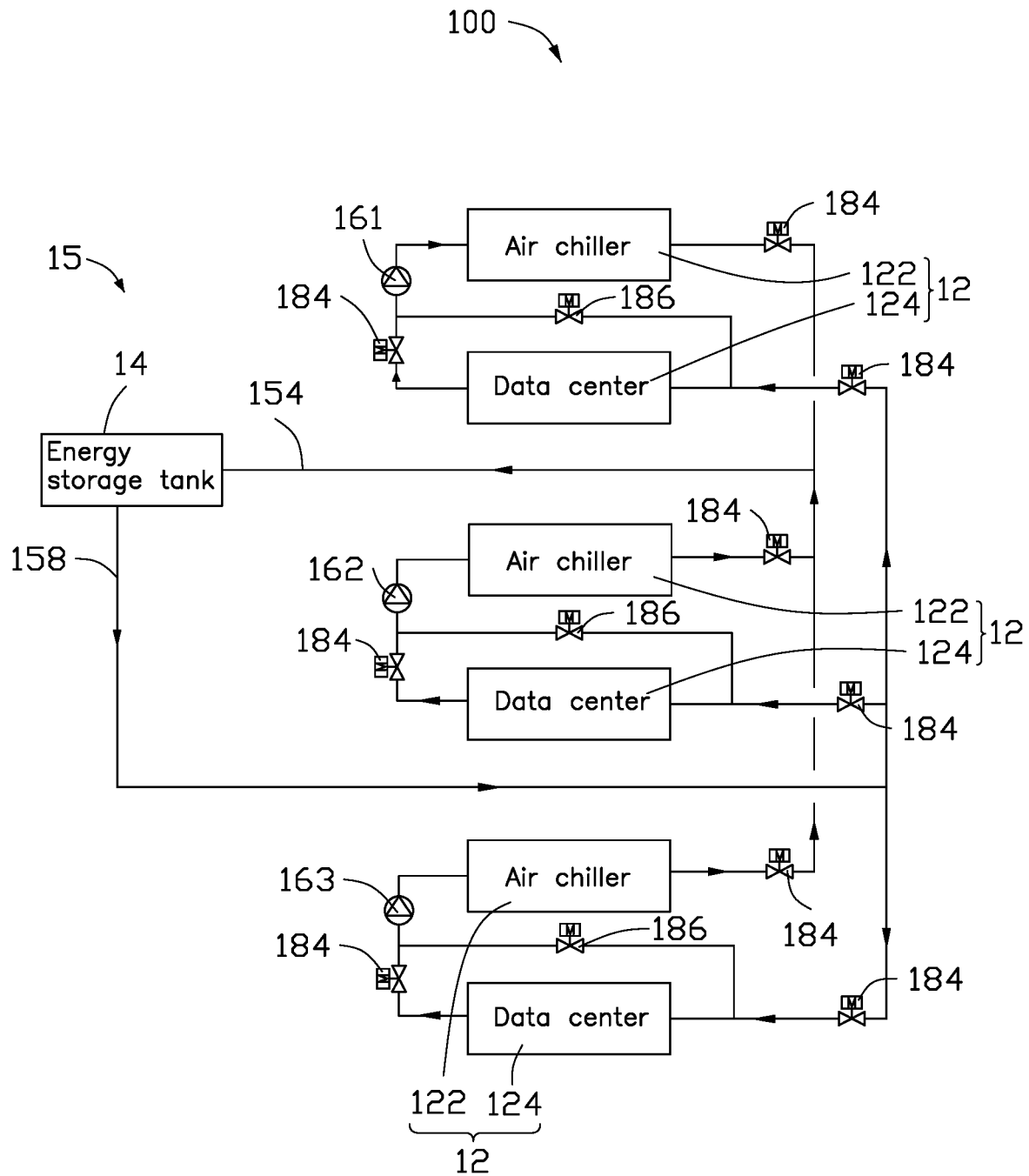
FIG. 4 is a schematic diagram of the operation of the data center heat recovery system according to an embodiment when the temperature is high.

Referring to FIG. 4, in one embodiment when the ambient temperature is higher than the second preset temperature, the data center heat recovery system 100 automatically turns off the fourth water pump 164, the fifth water pump 165, and all of the first electric two-way valves 182, and simultaneously maintains the first water pump 161, the second water pump 162, the third water pump 163, the second electric two-way valves 184, and the third electric two-way valves 186. At this time, the air chillers 122 are used to cool the second fluid in the second pipeline 15, the building heat pump system 10 stops working, and the data center heat recovery system 100 is in a high-temperature mode.

Figure 5:
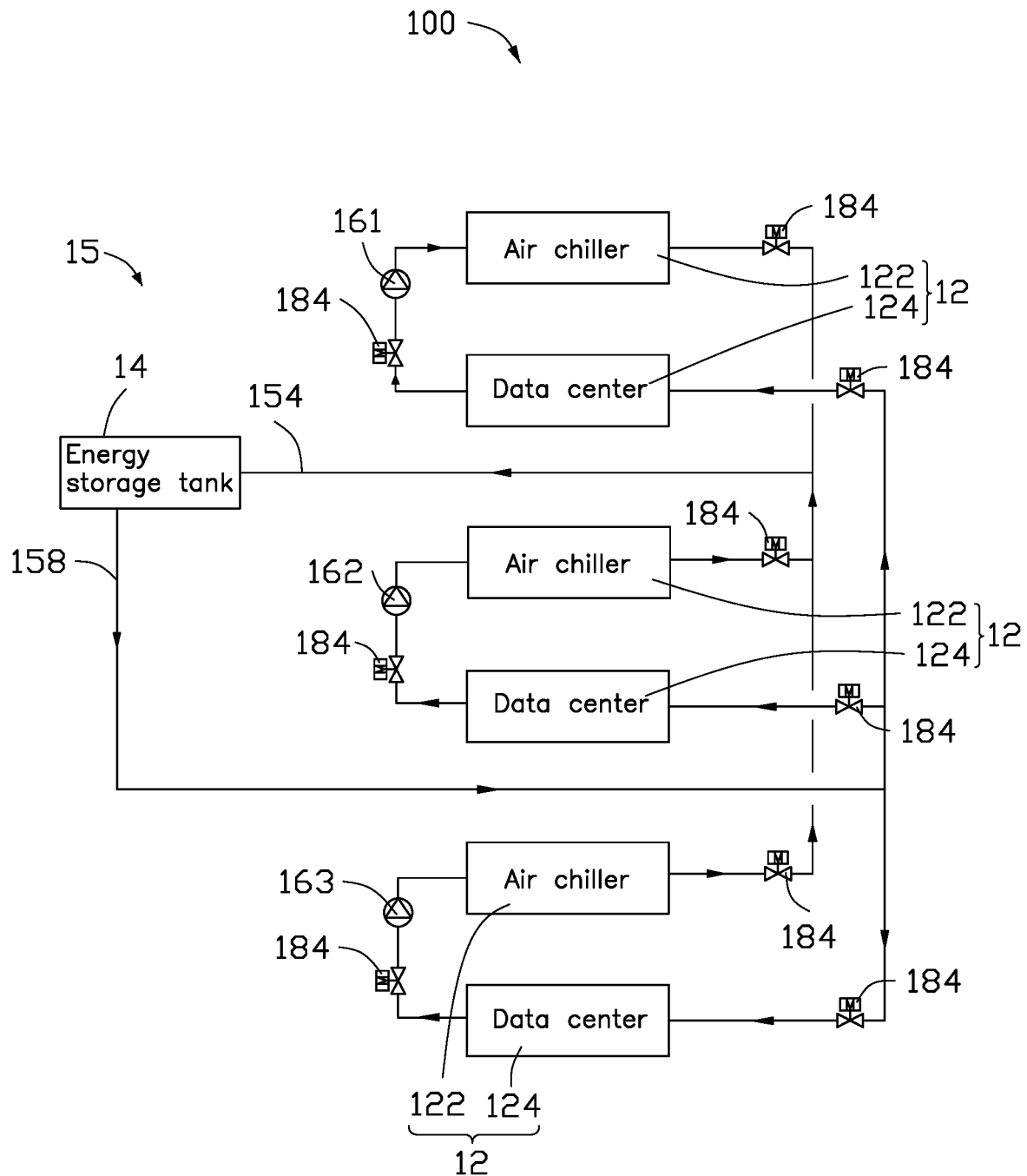
FIG. 5 is a schematic diagram of an emergency cooling operation of the data center heat recovery system according to an embodiment when the temperature is high.

Referring to FIG. 5, in one embodiment when the ambient temperature is higher than the second preset temperature, the data center heat recovery system 100 automatically shuts down the fourth water pump 164, the fifth water pump 165, all of the first electric two-way valves 182, and all of the third electric two-way valves 186, and simultaneously maintains the first water pump 161, the second water pump 162, the third water pump 163, and the second electric two-way valves 184 in an open state. At this time, the air chillers 122 are used to cool the second fluid in the second pipeline 15, the building heat pump system 10 stops working, and the data center heat recovery system 100 is in a high-temperature emergency cooling mode.

Referring to FIG. 2, in the low-temperature heat recovery mode, the energy storage tank 14 is coupled to the heat exchanger 11 through the first sub-pipeline 152, and the energy storage tank 14 is coupled to at least one of the data centers 124 through the third sub-pipeline 156. The energy storage tank 14 transports the second fluid to each of the data centers 124 through the third sub-pipeline 156, and each of the data centers 124 generates heat when the computer room (or air conditioner) is working, and the heat is transferred to the second fluid in the third sub-pipeline 156 to make the second fluid a thermal fluid.

Referring to FIG. 2, since the fifth water pump 165 located between the building heat pump system 10 and the heat exchanger 11 is maintained in the open state, the building heat pump system 10 can send the first fluid to the heat exchanger 11 through the first pipeline 13, and the first fluid flows into the heat exchanger 11. At the same time, the thermal fluid after passing through each of the data centers 124 is transmitted to the heat exchanger 11 through the second pipeline 15. The heat exchanger 11 collects the heat from the thermal fluid and transfers the collected heat to the building heat pump system 10 through the first fluid in the first pipeline 13, and the heat is used to heat the building. After the thermal fluid uses the heat, the second fluid is transferred to the energy storage tank 14 through the first sub-pipeline 152 for storage.

Referring to FIG. 2, the energy storage tank 14 stores the second fluid flowing from the heat exchanger 11 through the first sub-pipeline 152 and uses the third sub-pipeline 156 to dissipate heat for the data centers 124. Thus, the second fluid not only dissipates heat for each of the data centers 124, but also absorbs the waste heat generated by each of the data centers 124. At this time, the second fluid enters the heat exchanger 11 through the second pipeline 15, and the heat exchanger 11 collects the heat from the second fluid and transfers the collected heat to the first fluid. The building heat pump system 10 absorbs the heat from the first fluid and uses the heat to heat the building. The second fluid after the heat is absorbed by the heat exchanger 11 is directly transferred to the energy storage tank 14 through the first sub-pipeline 152, and the energy storage tank 14 transfers the second fluid through the third sub-pipeline 156 to each of the data centers 124 to form a cycle to make full use of the waste heat of the data centers 124.

In the low-temperature heat recovery mode, the data center heat recovery system 100 effectively utilizes the waste heat generated by the air conditioner or the data center 124 in the computer room, so that the collected waste heat is used by the building heat pump system 10 for heating, which reduces resource waste and has good practical value.

Referring to FIG. 3, in the low-temperature emergency cooling mode, the second fluid flowing through the data center 124 is transported to the heat exchanger 11 through the second pipeline 15. The collected heat continues to accumulate, and the second fluid after passing through the heat exchanger 11 is transported to the energy storage tank 14 through the first sub-pipeline 152, and the energy storage tank 14 dissipates the heat of each of the data centers 124 through the third sub-pipeline 156.

In the low-temperature emergency cooling mode, the data center heat recovery system 100 can temporarily maintain the heat dissipation of the data centers 124 through the second fluid stored in the energy storage tank 14 to avoid the data centers 124 overheating.

Referring to FIG. 4, in the high-temperature mode, the energy storage tank 14 is coupled to the air chillers 122 through the second sub-pipeline 154, and the air chillers 122 cool the second fluid passing through the data centers 124 to obtain a cold fluid. The energy storage tank 14 stores the cold fluid flowing through each of the air chillers 122 through the second sub-pipeline 154, and performs heat dissipation for each data center 124 through the fourth sub-pipeline 158.

Further referring to FIG. 4, a third electric two-way valve 186 is coupled in parallel between the air chiller 122 and the data center 124 in each of the modular data centers 12. A flow rate of the second fluid through the air chiller 122 is controlled by opening or closing the third electric two-way valve 186 for dissipating heat of the data center 124, so that the flow rate of the second fluid flowing through the air chiller 122 is maintained above a preset flow rate.

In one embodiment, a group control strategy of the air chillers 122 is adopted, so that automatic control technology is used to automatically monitor the air chillers 122, water pumps 16, and electric two-way valves 18 to redirect cold fluid from the energy storage tank 14 from data centers 124 operating at a lower load to data centers 124 operating at a higher load. Thus, in the high-temperature mode, the cold fluid generated by each of the air chillers 122 is concentrated in the energy storage tank 14, and then the energy storage tank 14 transports the cold fluid through the fourth sub-pipeline 158 to each of the data centers 124 for heat dissipation. The operating efficiency of the air chillers 122 is improved, and equipment maintenance costs are reduced.

Referring to FIG. 5, in the high-temperature emergency cooling mode, when the ambient temperature is higher than the second preset temperature, each of the air chillers 122 stops working due to a power outage or other factors. At this time, the energy storage tank 14 cannot collect the cold fluid through the second sub-pipeline 154. If the air chillers 122 stop working due to a power outage, the corresponding data centers 124 also stop working, and the heat generated by the data centers 124 cannot be quickly dissipated. At this time, the energy storage tank 14 transports the second fluid to each of the data centers 124 through the fourth sub-pipeline 158 for heat dissipation, so as to prevent the data centers 124 from overheating.

If the air chillers 122 stop working due to other reasons, the corresponding data center 124 can continue to work normally, so that the data center 124 continues to generate heat, so that the accumulated heat in the second fluid circulating through the data center 124 increases each time the second fluid circulates through the data center 124, until the second fluid in the energy storage tank 14 can no longer dissipate heat for the data center 124. Thus, in the high-temperature emergency cooling mode, after the air chiller 122 stops working, the second fluid stored in the energy storage tank 14 can temporarily maintain the heat dissipation of the corresponding data center 124.

In the low-temperature heat recovery mode of the above-mentioned modular data center heat recovery system 100, the waste heat generated in the computer room or air-conditioned data center 124 is collected through the second pipeline 15, and then the heat exchanger 11 exchanges heat with the building heat pump system 10 through the first pipeline 13 to form a cycle. Thus, energy is conserved for heating.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A data center heat recovery system comprising:
   a building heat pump system configured to provide a first fluid when an ambient temperature is lower than a first preset temperature;
   a heat exchanger coupled to the building heat pump system through a first pipeline and configured to receive the first fluid from the building heat pump system when the ambient temperature is lower than the first preset temperature, the heat exchanger and the building heat pump system forming a liquid circulation system; and
   a plurality of modular data centers, each of the plurality of modular data centers comprising an air chiller and a data center; wherein:
   each of the plurality of modular data centers is coupled to the heat exchanger through a second pipeline containing a second fluid;
   when the ambient temperature is higher than a second preset temperature, the air chiller cools the second fluid;
   when the ambient temperature is lower than the first preset temperature, the air chiller does not operate, the second fluid passing through the data center transports heat generated by the data center to the heat exchanger, the heat exchanger collects the heat from the second fluid, and the heat exchanger transports the collected heat to the building heat pump system through the first liquid in the first pipeline.

2. The data center heat recovery system of claim 1, further comprising an energy storage tank, wherein:
   the first pipeline comprises a first sub-pipeline, a second sub-pipeline, a third sub-pipeline, and a fourth sub-pipeline;
   the energy storage tank is coupled to the heat exchanger through the first sub-pipeline; and
   the energy storage tank is coupled to the data centers through the fourth sub-pipeline.

3. The data center heat recovery system of claim 2, wherein:
   when the ambient temperature is lower than the first preset temperature, the energy storage tank is coupled to the data centers through the third sub-pipeline, and the energy storage tank stores the second fluid flowing through the heat exchanger through the first sub-pipeline.

4. The data center heat recovery system of claim 2, wherein:
   when the ambient temperature is higher than the second preset temperature, the energy storage tank is coupled to the plurality of air chillers through the second sub-pipeline, the plurality of air chillers chill the second fluid passing through the data centers to obtain cold liquid, the cold liquid is transported to the energy storage tank through the second sub-pipeline, and the energy storage tank transports the cold liquid to the plurality of data centers through the fourth sub-pipeline.

5. The data center heat recovery system of claim 1, further comprising a plurality of water pumps and a plurality of electric two-way valves, wherein:
   the plurality of water pumps is configured to transport the first fluid in the first pipeline and the second fluid in the second pipeline; and
   the plurality of two-way valves controls a flowrate of the second fluid in the second pipeline.

6. The data center heat recovery system of claim 5, wherein:
   each of the plurality of modular data centers comprises the electric two-way valve located between the air chiller and the data center;
   when the ambient temperature is higher than the second preset temperature, the electric two-way valve controls the flowrate of the second fluid passing through the air chiller to maintain the flowrate of the second fluid above a preset flowrate.

7. The data center heat recovery system of claim 1, wherein:
   when the ambient temperature is higher than the second preset temperature, the building heat pump system does not operate.

8. The data center heat recovery system of claim 1, wherein:
   the heat exchanger is a plate heat exchanger.

9. The data center heat recovery system of claim 1, wherein:
   the first preset temperature is 10 degrees Celsius.

10. The data center heat recovery system of claim 1, wherein:
    the second preset temperature is 20 degrees Celsius.

11. A data center heat recovery system comprising:
    a building heat pump system configured to provide a first fluid when an ambient temperature is lower than a first preset temperature;
    a heat exchanger coupled to the building heat pump system through a first pipeline and configured to receive the first fluid from the building heat pump system when the ambient temperature is lower than the first preset temperature, the heat exchanger and the building heat pump system forming a liquid circulation system;

a plurality of modular data centers, each of the plurality of modular data centers comprising an air chiller and a data center; and an energy storage tank coupled to the heat exchanger and the data centers through the first pipeline; wherein:

each of the plurality of modular data centers is coupled to the heat exchanger through a second pipeline containing a second fluid;

when the ambient temperature is higher than a second preset temperature, the air chiller cools the second fluid; and when the ambient temperature is lower than the first preset temperature, the air chiller does not operate, the second fluid passing through the data center transports heat generated by the data center to the heat exchanger, the heat exchanger collects the heat from the second fluid, and the heat exchanger transports the collected heat to the building heat pump system through the first fluid in the first pipeline.

12. The data center heat recovery system of claim 11, wherein:

the first pipeline comprises a first sub-pipeline, a second sub-pipeline, a third sub-pipeline, and a fourth sub-pipeline;

the energy storage tank is coupled to the heat exchanger through the first sub-pipeline; and the energy storage tank is coupled to the data centers through the fourth sub-pipeline.

13. The data center heat recovery system of claim 12, wherein:

when the ambient temperature is lower than the first preset temperature, the energy storage tank is coupled to the data centers through the third sub-pipeline, and the energy storage tank stores the second fluid flowing through the heat exchanger through the first sub-pipeline.

14. The data center heat recovery system of claim 12, wherein:

when the ambient temperature is higher than the second preset temperature, the energy storage tank is coupled to the plurality of air chillers through the second sub-pipeline, the plurality of air chillers chill the second fluid passing through the data centers to obtain cold liquid, the cold liquid is transported to the energy storage tank through the second sub-pipeline, and the energy storage tank transports the cold liquid to the plurality of data centers through the fourth sub-pipeline.

15. The data center heat recovery system of claim 11, further comprising a plurality of water pumps and a plurality of electric two-way valves, wherein:

the plurality of water pumps is configured to transport the first fluid in the first pipeline and the second fluid in the second pipeline; and the plurality of two-way valves controls a flowrate of the second fluid in the second pipeline.

16. The data center heat recovery system of claim 15, wherein:

each of the plurality of modular data centers comprises the electric two-way valve located between the air chiller and the data center;

when the ambient temperature is higher than the second preset temperature, the electric two-way valve controls the flowrate of the second fluid passing through the air chiller to maintain the flowrate of the second fluid above a preset flowrate.

17. The data center heat recovery system of claim 11, wherein:

when the ambient temperature is higher than the second preset temperature, the building heat pump system does not operate.

18. The data center heat recovery system of claim 11, wherein:

the heat exchanger is a plate heat exchanger.

19. The data center heat recovery system of claim 11, wherein:

the first preset temperature is 10 degrees Celsius.

20. The data center heat recovery system of claim 11, wherein:

the second preset temperature is 20 degrees Celsius.

* * * * *